(12) United States Patent
Lee et al.

(10) Patent No.: US 6,181,641 B1
(45) Date of Patent: Jan. 30, 2001

(54) MEMORY DEVICE HAVING REDUCED POWER REQUIREMENTS AND ASSOCIATED METHODS

(75) Inventors: Dongho Lee, Manassas; Tri Minh Hoang, Clifton; Livia Zien, Manassas; Scott Doyle, Centreville; David Lawson, Harwood, all of VA (US)

(73) Assignee: Lockheed Martin Corporation, Bethesda, MD (US)

( * ) Notice: Under 35 U.S.C. 154(b), the term of this patent shall be extended for 0 days.

(21) Appl. No.: 09/320,227

(22) Filed: May 26, 1999

(51) Int. Cl.[7] ................................................ G11C 8/00
(52) U.S. Cl. .................... 365/233.5; 365/203; 365/233; 365/230.03
(58) Field of Search ............................. 365/233.5, 194, 365/203, 230.03, 233

(56) References Cited

U.S. PATENT DOCUMENTS

| | | | |
|---|---|---|---|
| 4,969,125 | 11/1990 | Ciraula et al. ................... | 365/203 |
| 5,424,986 | * 6/1995 | McClure ............................. | 365/200 |
| 5,566,129 | * 10/1996 | Nakashima et al. ............... | 365/233.5 |
| 5,566,130 | * 10/1996 | Durham et al. ................... | 365/233.5 |
| 5,694,369 | * 12/1997 | Abe ................................... | 365/210 |
| 5,781,469 | * 6/1998 | Pathak et al. ..................... | 365/156 |
| 5,875,133 | * 2/1999 | Miyashita et al. ............... | 365/189.09 |
| 5,943,288 | * 8/1999 | Jiang ................................. | 365/230.06 |

* cited by examiner

*Primary Examiner*—Son T. Dinh
*Assistant Examiner*—Hien Nguyen
(74) *Attorney, Agent, or Firm*—Allen, Dyer, Doppelt, Milbrath & Gilchrist, P.A.

(57) ABSTRACT

A memory device includes a plurality of memory cells arranged in rows and columns. The memory cells are divided into a plurality of sub-arrays. The memory cell further includes a plurality of word lines connecting rows of the memory cells, and a plurality of bit line pairs connecting columns of the memory cells. An address transition detect (ATD) circuit detects an address transition for a selected memory cell and generates an ATD pulse in response thereto. A respective bit line precharge circuit is associated with each of the plurality of sub-arrays. An ATD pulse distribution circuit distributes the ATD pulse to only a selected sub-array containing the selected memory cell to activate only the bit line precharge circuit of the selected sub-array and not activate precharge circuits of other non-selected sub-arrays.

38 Claims, 8 Drawing Sheets

MEMORY DEVICE HAVING REDUCED POWER REQUIREMENTS AND ASSOCIATED METHODS

This invention was made with Government support under Contract Number DSWA-01-96-C-0106 awarded by the Department of the Air Force. The Government has certain rights in this invention.

FIELD OF THE INVENTION

The present invention relates to the field of integrated circuits, and, more particularly, to a memory device.

BACKGROUND OF THE INVENTION

A static random access memory (SRAM) includes a memory array made up of memory cells in an arrangement of rows and columns. A single data bit in binary form can be stored in each memory cell. Each row includes a word line that interconnects memory cells on the row with a common control signal. Similarly, each column includes a complementary pair of bit lines coupled to at most one cell in each row. The word and bit lines can be controlled to individually access each memory cell of the memory array.

An asynchronous SRAM does not respond to a clock signal. Instead, an asynchronous SRAM responds to an address change. An address transition detect (ATD) circuit detects whether there has been a transition made on an address line. The ATD circuit indicates selection of a memory cell in a row different from a previously selected memory cell, and generates an address transition detect (ATD) pulse indicating an address change. Address transition detection is only necessary for a row address transition because precharging the bit lines is not necessary for a column address change. However, the ATD circuit may be applied to all addresses and/or control signals.

There is a bit line precharge circuit for each column of bit line pairs in the SRAM. Before data can be read out of the selected memory cell, the bit line pair associated with the selected memory cell must be precharged. Each time a subsequent memory cell on a new column is selected, the bit line pair for that corresponding memory cell must also be precharged before the data value can be read.

The bit line precharge circuits effectively connect the bit line pairs to a reference supply voltage. The reference supply voltage is typically midway between the high and low logic levels of the memory device. Conventionally, bit line pairs are precharged to one-half of the power supply voltage. If the bit line pairs were not precharged, a voltage difference present on the bit line pair may inadvertently discharge a value into the selected memory cell due to the high capacitive load caused by the other memory cells connected to the same bit line pair.

Currently, upon detection of a row address transition, the ATD pulse is globally applied to all the bit line precharge circuits 22 in an SRAM device 30, as shown in FIG. 1. An address input circuit 24 receives an address signal and provides the signal to the ATD circuit 20. The ATD circuit 20 detects whether there has been a transition in the address signal from a previously received address signal, and if so, generates an ATD pulse. The ATD pulse is then applied globally to all of the bit line precharge circuits 22.

The term global in this illustration means that all the bit line precharge circuits, collectively represented by the single block 22, receive the ATD pulse for initiating precharging of their respective bit line pairs. As a result, all the bit line pairs are simultaneously precharged, which is typically to one-half of the power supply voltage. Simultaneously precharging all the bit line precharge circuits 22 causes the SRAM 30 to dissipate unnecessary power since data can only be read out of one memory cell at a time during a bit line precharge cycle. Another disadvantage of simultaneously precharging all the bit line precharge circuits 22 is that large voltage spikes occur, which tends to generate noise and cause the voltage level at the power pad to drop due to package (pin) inductance.

U.S. Pat. No. 4,969,125 to Caerula, et al., hereinafter referred to as the '125 Patent and is hereby incorporated by reference, discloses an SRAM device 39 having a segmented memory array that eliminates the problem of large current spikes by limiting the number of precharge circuits that are simultaneously precharged in response to the ATD pulse, as shown in FIG. 2. The memory array 40 is divided into a plurality of memory array segments 42a–42n, with each memory array segment containing a portion of all the bit line pairs. Each memory array segment 42a–42n has a bit line precharge circuit 44 for precharging the bit line pairs associated therewith so that when the ATD circuit 46 generates the ATD pulse, only the bit line pairs associated with a selected memory array segment 42a are precharged. The segmented precharged driver 48 corresponding to the memory array segment 42a containing the memory cell to be read is selected for precharging the bit line precharged circuit 44.

A drawback of the segmented SRAM device 39 disclosed in the '125 Patent is that the ATD pulse is still distributed to all the segmented precharged drivers 48. This causes the SRAM 39 to dissipate unnecessary power since only one of the segmented precharge drivers 48 is actually selected for providing the ATD pulse to the memory array 42a. In addition, interfacing the ATD circuit 46 with each segmented precharge driver 48 causes the output of the ATD circuit 46 to see a large capacitive load. A large capacitive load slows down the rise and fall time of the ATD pulse and its propagation to the segmented precharge drivers 48. Consequently, a delayed and loosely controlled ATD pulse slows down the access time of the SRAM device 39.

To better control the ATD pulse in the '125 Patent, each address input has a true signal path and a complement signal path connected to respective address pulse generators. In other words, there is an address pulse generator for detecting a rising address transition and a separate address pulse generator for detecting a falling address transition.

SUMMARY OF THE INVENTION

In view of the foregoing background, it is therefore an object of the present invention to reduce the power consumption of an SRAM device.

It is another object of the invention to provide a tightly controlled ATD pulse.

It is yet another object of the invention to provide a method for providing a localized ATD signal for precharging bit line pairs when reading a data value from a selected memory cell, which results in a reduction in the power consumption of the SRAM.

These and other objects, features and advantages in accordance with the present invention are provided by a memory device having a plurality of memory cells arranged in rows and columns and divided into a plurality of sub-arrays. A plurality of word lines connect rows of the memory cells, and a plurality of bit line pairs connect columns of the memory cells.

An ATD circuit detects an address transition for a selected memory cell and generates an ATD pulse in response thereto. A respective bit line precharge circuit is associated with each of the plurality of sub-arrays. The memory device includes an ATD distribution circuit for distributing the ATD pulse to only a selected sub-array containing the selected memory cell so as to activate only the bit line precharge circuit of the selected sub-array and not activate precharge circuits of other non-selected sub-arrays.

By activating the precharge circuit of only the selected sub-array, the active power of the memory device is reduced. When the memory device is included in an electronic device that operates from a battery powered source or is included in an electronic device which has limited ability to generate power, such as a satellite, for example, operation of the electronic device is prolonged.

The plurality of memory cells may be divided into N blocks of memory cells, and each block may then be further divided into M sub-arrays. The ATD distribution circuit thus includes a block distribution circuit for distributing the ATD pulse to only a selected block containing the selected sub-array, and a plurality of sub-array distribution circuits associated with each block for distributing the ATD pulse to the bit line precharge circuit associated with the selected memory cell in the selected sub-array. Since the ATD pulse is segmented, the resulting capacitive load to the output of the ATD circuit is significantly reduced. This allows the memory device to dissipate less power for propagating the ATD pulse to the selected precharge circuit.

The ATD circuit includes a single address pulse generator connected to a respective address input for detecting both high and low address transitions. Each address pulse generator includes a delay circuit having an input receiving an address signal and an output providing a delayed address signal, and an exclusive-OR gate having a first input receiving the address signal and a second input connected to the output of said delay block. The amount of the delay in the delay circuit may be used to control the width of the ATD pulse. By setting the delay to be short, a narrow ATD pulse is generated which is advantageous for a shorter access time for the memory device.

The memory device is a static random access memory (SRAM), which may operate asynchronously or synchronously. The active power of an SRAM device with respect to precharging bit line pairs is thus reduced when reading data from a selected memory cell. The ATD pulse is applied only to the bit line precharge circuit associated with a selected sub-array. Consequently, only the bit-line precharge circuit associated with the selected sub-array consumes power for charging bit line pairs when reading data from a selected memory cell. In addition, switching activity for routing the ATD pulse is significantly reduced across the memory device since the ATD pulse is gated with further levels of decode to reduce the number of lines that switch during any clock cycle.

Another aspect of the invention relates to a method for reading a selected memory cell in a memory comprising a plurality of memory cells arranged in sub-arrays, word lines connecting rows of memory cells, bit lines connecting columns of memory cells, and a respective bit line precharge circuit for each of the sub-arrays. The method includes the steps of generating an ATD pulse, and distributing the ATD pulse to only a selected sub-array containing a selected memory cell so as to activate only the bit line precharge circuit of the selected sub-array and not activate precharge circuits of other non-selected sub-arrays.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
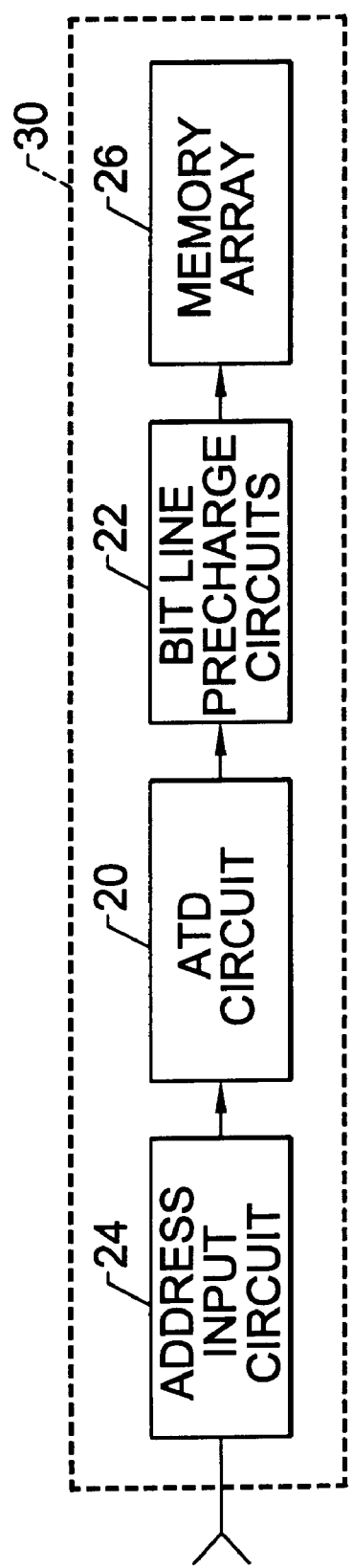
FIG. 1 is a block diagram of a global ATD circuit in an SRAM, according to the prior art.
Figure 2:
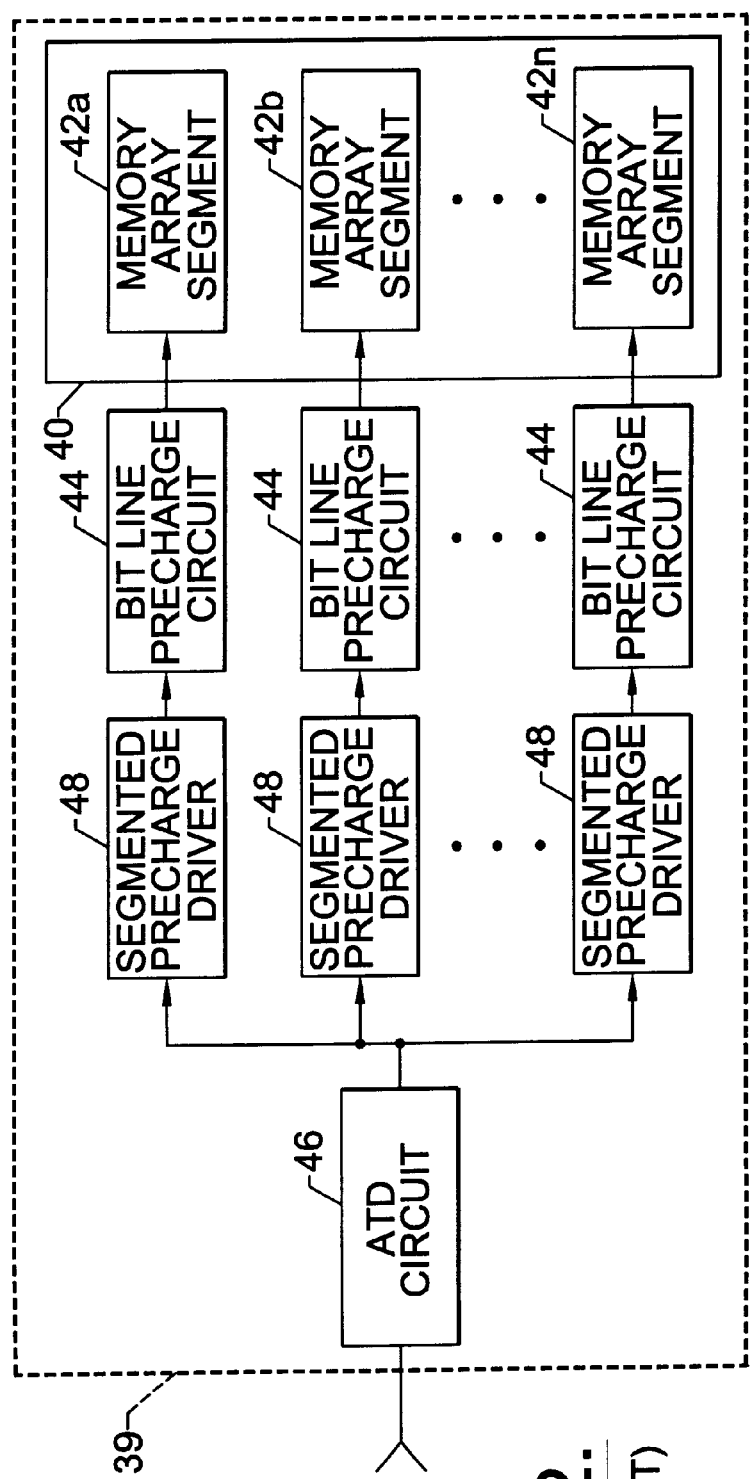
FIG. 2 is a block diagram of a global ATD circuit for a segmented memory array in an SRAM, according to the prior art.
Figure 3:
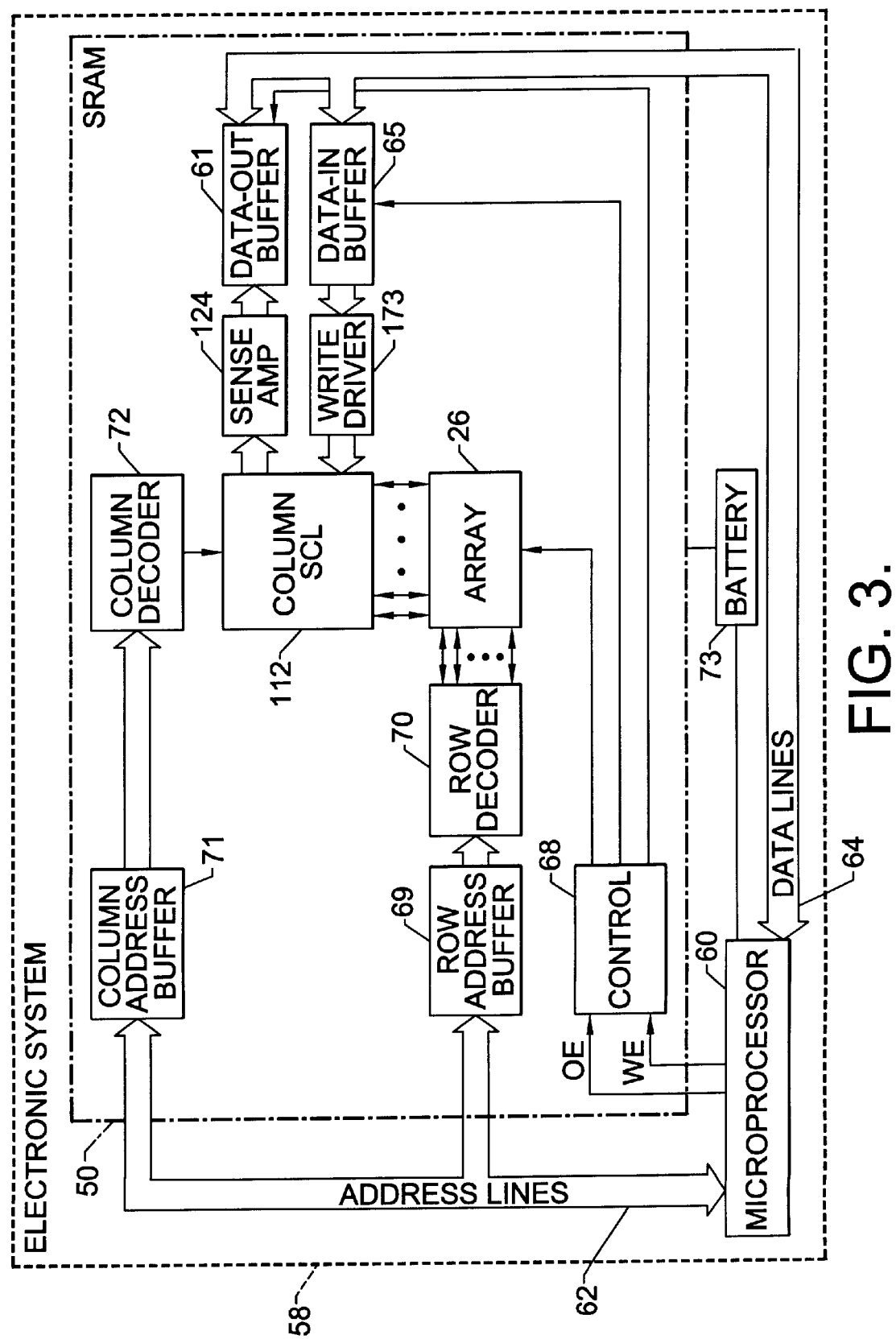
FIG. 3 is a block diagram of one embodiment of an SRAM coupled to an electronic system, according to the present invention.

A static random access memory (SRAM) 50 is typically included in an electronic system 58, as illustrated in FIG. 3. More particularly, the electronic system 58 includes a microprocessor 60 that interfaces with the SRAM 50 to provide and/or receive control, address and data information over a memory bus represented by individual inputs to the SRAM 50. These individual inputs are illustrated by data lines 64, address lines 62 and various discrete lines from the control logic circuit 68. Alternatively, the SRAM 50 may interface with an SRAM controller, a microcontroller, a chip set or other electronic system. The electronic system 58 may be powered by a battery 73.

The microprocessor 60 provides a number of control signals to the SRAM 50, including, but not limited to, row and column address signals, a chip select signal, a write enable signal WE, an output enable signal OE and other conventional control signals as will be understood by those skilled in the art. Positive or negative logic may be used for the SRAM control signals. A control logic circuit 68 controls the many available functions of the SRAM 50, such as controlling data provided to the data-in buffers 61 by the microprocessor 60 and data provided to the microprocessor by the data-out buffers 65. In addition, various control circuits and signals not detailed herein initiate and synchronize the SRAM 50 operations as also known to those skilled in the art.

A row address buffer 69 and a row decoder 70 receive and decode row addresses from row address signals placed on the address lines 62 by the microprocessor 60. Each unique row address corresponds to a row of cells in the memory array 26. The row decoder 70 includes a word line driver, an address decoder tree, and circuitry which translates a given row address received from the row address buffers 69 and selectively activates the appropriate word line of the memory array 26 via the word line drivers. A column address buffer 71 and a column decoder 72 receive and decode column address signals provided on the address lines 62. The column decoder is coupled to the column selector 112, and to complementary bit line pairs of the memory array 26. The column selector 112 is also coupled to sense amplifiers 124 and write drivers 123, as will be readily understood by one skilled in the art. The sense amplifiers 124 are coupled to the data lines via the data-out buffers 61. Similarly, the write drivers 123 are coupled to the data lines via the data-in buffers 65.

During a write operation, the data lines 64 provide data to the data-in buffers 61 from the microprocessor 60. Write drivers 123 receive data from the data-in buffers 61 and write the data in the memory array 26 at an address specified on the address lines 62. During a read operation, a sense amplifier of the sense amplifiers 124 detects and amplifies a difference in voltage between the complementary bit line pair. Address information received on the address lines 62 selects a subset of the bit lines and couples them to the complementary pairs of input/output (I/O) wires or lines.

Figure 4:
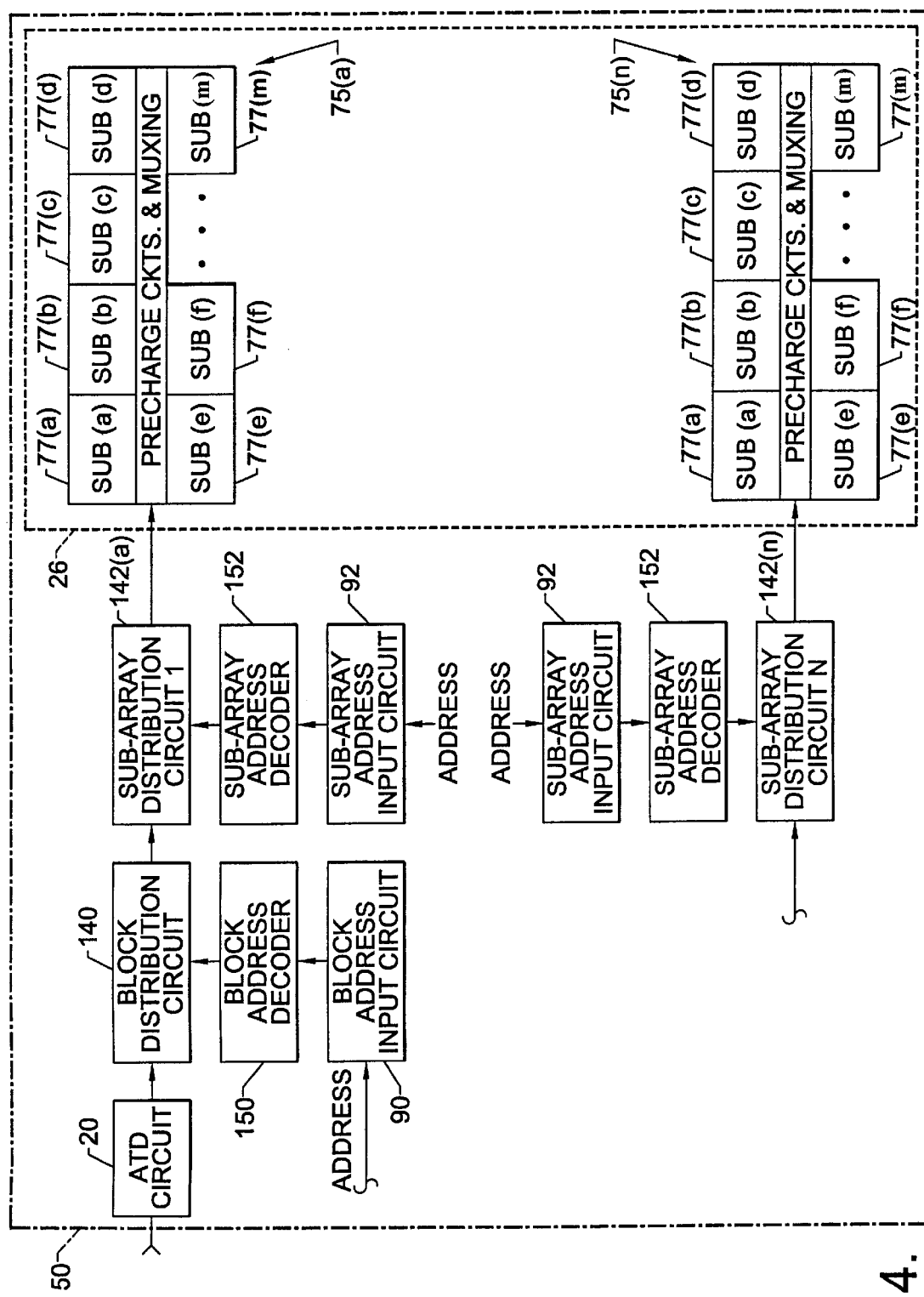
FIG. 4 is a block diagram of one embodiment of a localized ATD pulse distribution configuration in an SRAM, according to the present invention.
Figure 5:
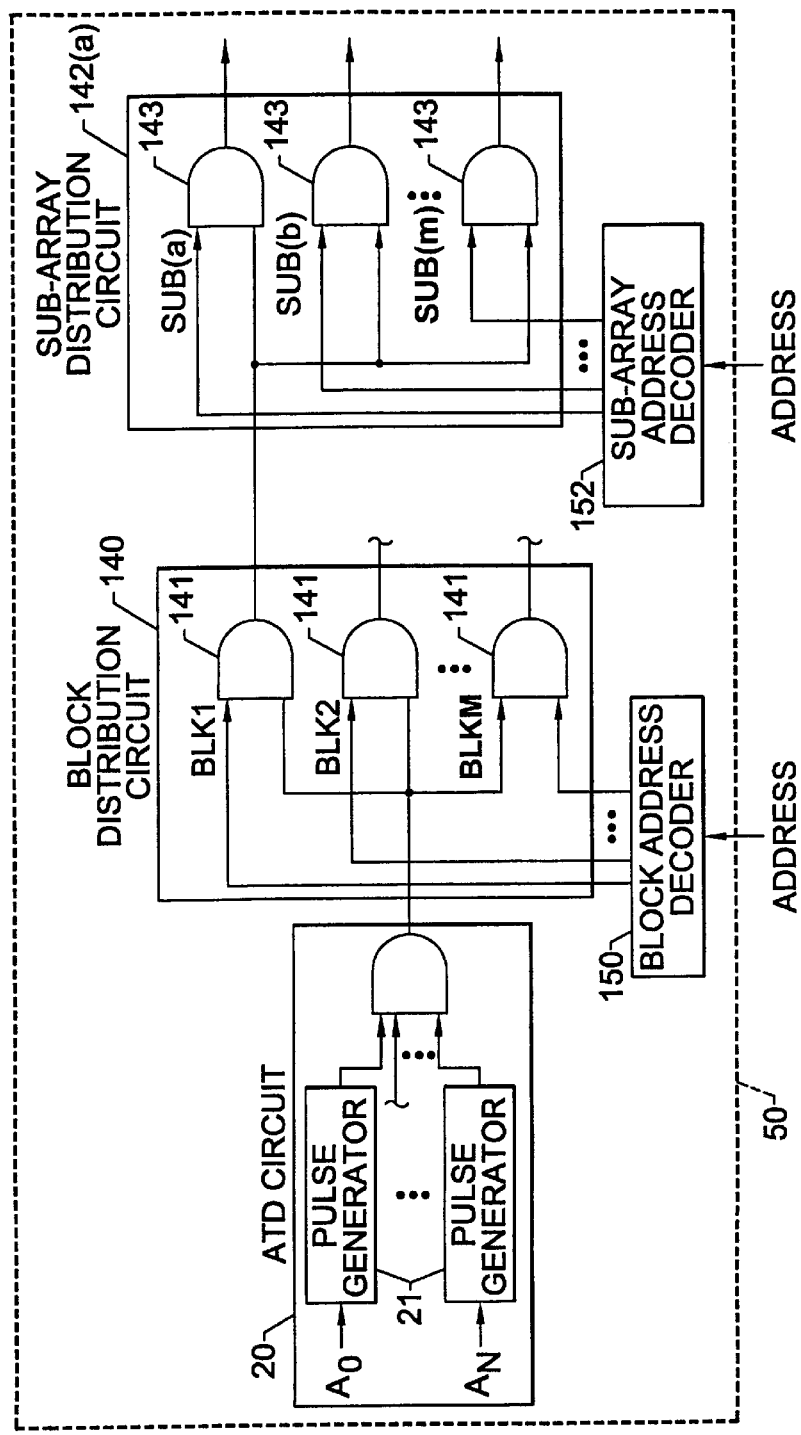
FIG. 5 is a more detailed block diagram on the embodiment of the localized ATD pulse distribution configuration illustrated in FIG. 4.

Dividing or segmenting a memory array 26 into sub-arrays will be readily understood by those skilled in the art, and reference is directed to the '125 Patent which has been incorporated herein by reference. In the illustrated SRAM 50, the memory array 26 is divided into 8 blocks 75a–75n, and each block is further divided into 8 sub-arrays 77a–77m, as shown in FIGS. 4 and 5. For example, a 4 MB SRAM has 512 k memory cells in each of the 8 blocks 75a–75m, and each sub-array 77a–77m has 64 k memory cells. Of course, the number of blocks and sub-arrays within a memory array can significantly vary depending on the size of the memory array, as will be readily understood by one skilled in the art. Furthermore, the number of sub-arrays does not have to equal the number of blocks.

The input terminal of the ATD circuit 20 is connected to an address input circuit 24. The ATD circuit 20 includes a respective address pulse generator 21 connected to each address input. In a read mode, the ATD circuit 20 detects a transition of a different row address signal received by the address input circuit 24, and generates an ATD pulse in response thereto. Typically, address transition detection is only for a row address transition because precharging the bit line pairs is not necessary for a column address change since the bit line pair have already been precharged in the selected sub-array 77a.

The ATD pulse is applied to a block distribution circuit 140. The ATD pulse is applied to a plurality of AND gates 141 within the block distribution circuit 140, as best shown in FIG. 5. The block distribution circuit 140 selects one of the N blocks 75a–75n within the memory array 26 to receive the ATD pulse by applying a block address signal to a selected AND gate 141. This selection is based upon the block address signal provided by the microprocessor 60 to the block address input circuit 90. The received block address signal is then applied to a block address decoder 150, the output of which is applied to the block distribution circuit 140 for selecting the AND gate 141 corresponding to the block 75a containing the selected memory cell.

Selection of a particular sub-array 77a–77n within one of the selected N blocks 75a–75n for receiving the ATD pulse is as follows. The ATD pulse from a selected one of the N blocks 75a–75n is applied to a selected one of the sub-array distribution circuits 142a–142n associated with the selected memory cell. Each sub-array distribution circuit 142a–142n includes a plurality of AND gates 143 for receiving the ATD pulse, as best shown in FIG. 5. The sub-array distribution circuit 142a selects one of the M sub-arrays 77a–77m within the corresponding block for receiving the ATD pulse. This selection is based upon a sub-array address signal provided by the microprocessor 60 to the sub-array address input circuit 92. The received sub-array address signal is applied to a sub-array address decoder 152, the output of which is applied to the selected sub-array distribution circuit 142a for selecting the AND gate 143 corresponding to the block 75a containing the selected memory cell. The output of the selected sub-array distribution circuit 142a is applied to the pre-charge circuit 22 associated with the selected sub-array for precharging the bit lines therein.

Advantageously, the ATD pulse is changed from a global signal to a local signal in accordance with the present invention. That is, instead of applying the ATD pulse to all the bit-line precharge circuits 22 for precharging the bit line pairs of the entire SRAM 50, the ATD pulse is applied only to a selected sub-array for precharging the bit-line pairs associated with the selected sub-array. Switching activity is significantly reduced across the SRAM 50 since the ATD pulse is gated with further levels of decode to reduce the number of lines that switch during any clock cycle. When the memory array 26 is divided into 64 sub-arrays, for example, the active power of the SRAM 50 with respect to precharging the bit line pairs is thus reduced by 63/64. This is because only one of the 64 sub-arrays has it bit lines discharged when reading data from a selected memory cell. In other words, discharging the bit line pairs of the nonselected sub-arrays 75b–75m is not necessary since they remain in precharge while the selected sub-array is accessed.

Figure 6:
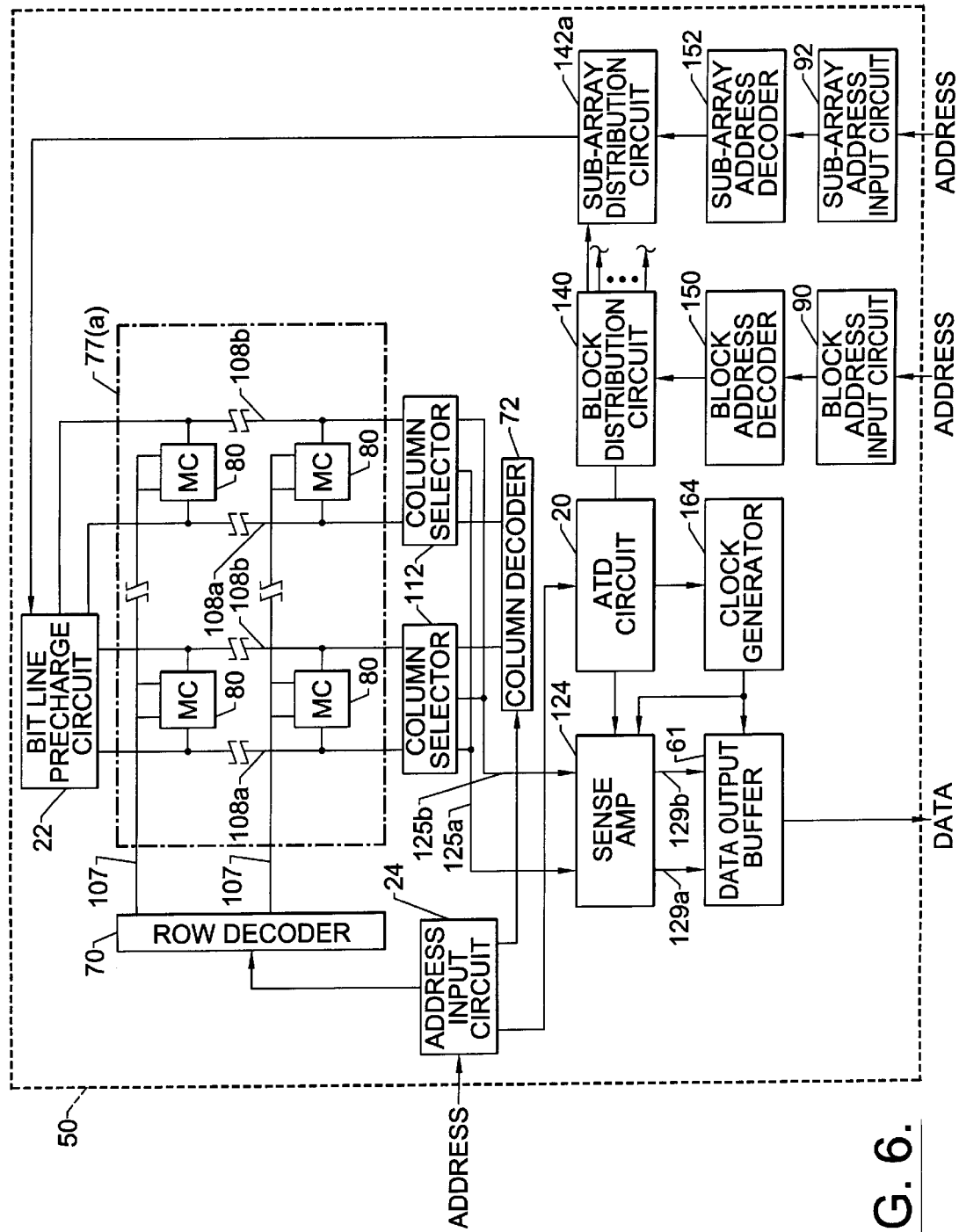
FIG. 6 is a more detailed block diagram on the embodiment of the architecture of the SRAM illustrated in FIG. 3.

The architecture of the SRAM 50 in accordance with the present invention will now be discussed in more detail with reference to FIG. 6. The following description of the SRAM 50 has been simplified for purposes of more clearly illustrating the present invention and is not a complete description of all the features of an SRAM. The illustrated SRAM 50 is asynchronous, that is, the SRAM 50 responds to an address input signal instead of an external clock signal.

An address input circuit 24 receives row and column address signals from the microprocessor 60 corresponding to a memory cell 80 to be selected. At the same time, a block address input circuit 90 and a sub-array address input circuit 92 receive respective address signals corresponding to the block and sub-array location of the selected memory cell.

An output terminal from the address input circuit 24 is connected to an input terminal of the row decoder 70. The row decoder 70 decodes a row address signal received by the address input circuit 24. Word lines 107 are connected to the output terminals of the row decoder 70. The word lines 107 are selectively driven by an output signal of the row decoder 70. When the row decoder 70 selects a particular word line 107, that word line is common to the same row in each sub-array 77a–77m.

Within each sub-array 77a–77m, paired bit lines 108a and 108b are positioned orthogonal to the row lines 107. Each bit line pair 108a, 108b is coupled at a first end to a bit line precharge circuit 22. Each bit line precharge circuit 22 precharges a bit line pair 108a, 108b to a predetermined potential, as will be readily understood by one skilled in the art. Static memory cells are located at the cross-points of the word lines 107 and the bit line pairs 108a and 108b, and respectively form a sub-array, such as 77a illustrated in FIG. 6.

Each sub-array 77a–77m includes a respective column selector 112 and bit line precharge circuit 22 for the bit-line pairs 108a, 108b within the sub-array. The column selector 112 is driven by a column select signal supplied through an output line of the column decoder 72. When the column decoder 72 selects a particular bit line pair 108a, 108b, that bit line pair is common to each sub-array 77a–77m. For example, if the illustrated SRAM 50 has 256 columns, then the column decoder 72 selects anyone of the 256 columns based upon the address signal received by the address input circuit 24. However, the ATD pulse generated by the ATD circuit 20 is only applied to the bit line precharge circuits 22 within a selected sub-array 77a. In lieu of selecting a bit line pair 108a, 108b common to each sub-array 77a–77m, the column decoder 72 may select only the bit line pair corresponding to the sub-array having the selected memory cell.

A sense amplifier 124 is connected to the output terminal of the column selectors 112 through a pair of sense amplifier input lines 125a, 125b. The sense amplifier 124 amplifies the data placed on the corresponding bit line pair 108a, 108b for a memory cell 80 selected by the row decoder 70 and a corresponding column decoder 72. A data output buffer 61 is connected to the output terminals of the sense amplifier 124 through a pair of sense amplifier output lines 129a, 129b. The voltage corresponding to the stored data value in the selected memory cell 80 is placed on the corresponding bit line pair 108a, 108b. The voltage level is amplified by the sense amplifier 124 and provided to the data output buffer 61.

The ATD pulse from the ATD circuit 20 is also applied to the sense amplifier 124, and to a clock signal generator 164. The clock signal generator 164 generates a clock signal that is active for a fixed period so that the sense amplifier 124 and the data output buffer 61 are made active during the fixed period.

As stated above, the description of the SRAM 50 has been simplified for purposes of illustrating the present invention and is not a complete description of all the features of an SRAM. The SRAM 50 implementation described herein is illustrative only and not intended to be exclusive or limiting.

As a result of segmenting the ATD pulse, the capacitive loading to the output of the ATD circuit 20 is significantly reduced. Consequently, the pulse width of the ATD pulse can be more tightly controlled. With the localized ATD pulse distribution system of the present invention, the ATD pulse width is now in the range of about 3–4 ns as compared to about 6–8 ns for a global ATD pulse distribution. A shorter ATD pulse width improves the access time of the SRAM 50, which in turn improves performance.

Figure 7:
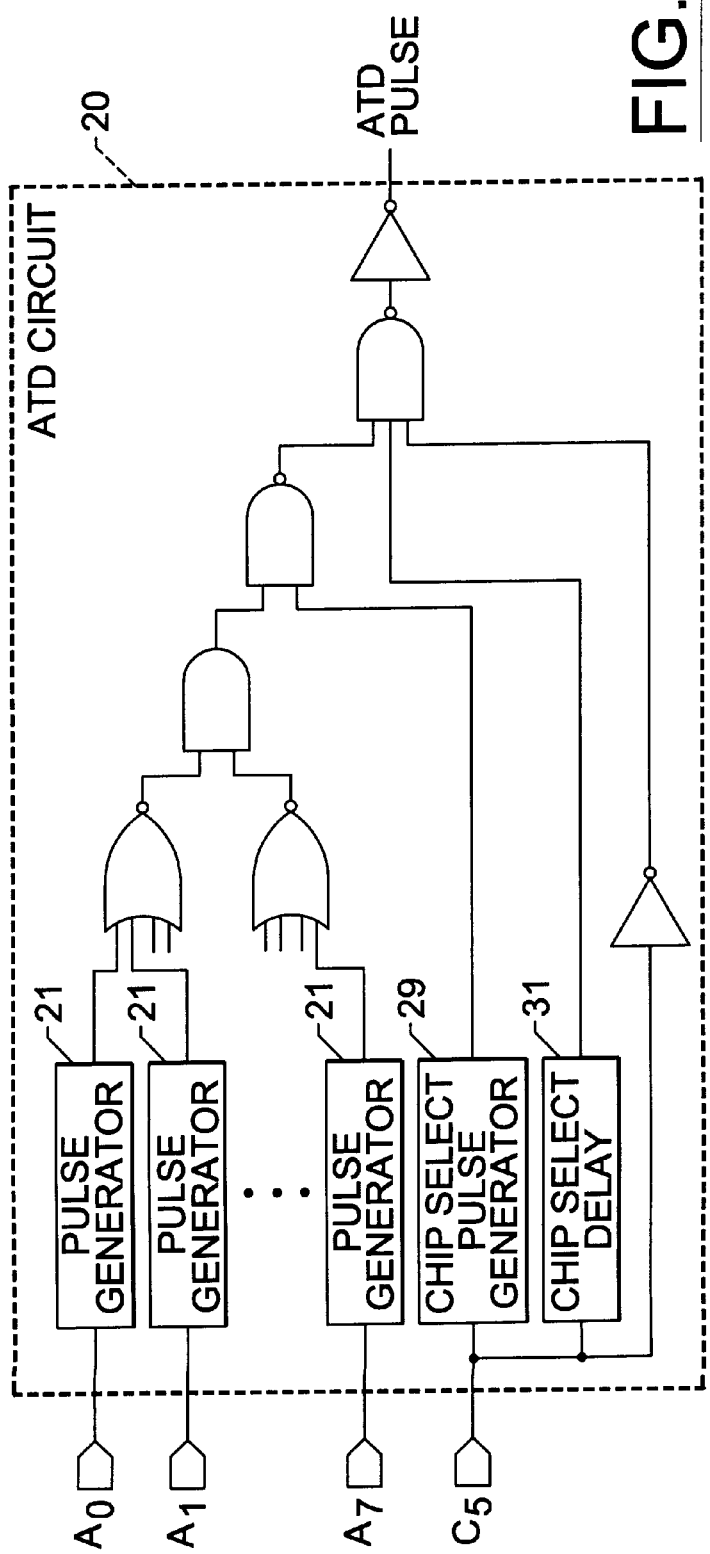
FIG. 7 is a block diagram of one embodiment of the ATD circuit, according to the present invention.

The address receiver connected to each address pulse generator 21 provides a single true signal, instead of a true and a complement signal, as best shown in FIG. 7. The ATD circuit 20 includes a single address pulse generator 21 for each address receiver, and wherein the single address pulse generator 21 can equally detect a rising address transition and a falling address transition over the single line interface with each address receiver. The outputs of the address pulse generators 21 are routed through a series of logic gates to provide the ATD pulse for an address transition on anyone of the address input lines A0–A7. The ATD circuit 20 also includes a chip select pulse generator 29 and a chip select delay 31, as will be readily understood by one skilled in the art.

Figure 8A:
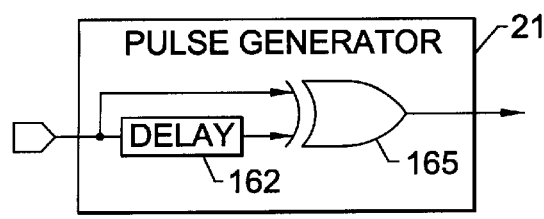
FIGS. 8a and 8b are respectively block diagrams of embodiments of an address pulse generator circuit and a more detailed block diagram of the delay circuit illustrated in the address pulse generator circuit.

Advantageously, a single address pulse generator 21 is used for generating a pulse corresponding to an address transition. Each address pulse generator 21 includes a delay circuit 162 having an input receiving the address signal, and an output providing a delayed address signal, as shown in FIG. 8a. The delayed address signal is applied to an input of an exclusive-OR circuit 165. The exclusive-OR 165 allows a single address pulse generator 21 to equally detect in time a rising address transition and a falling address transition. The undelayed address signal is also applied as an input to the exclusive-OR 165.

Figure 8B:
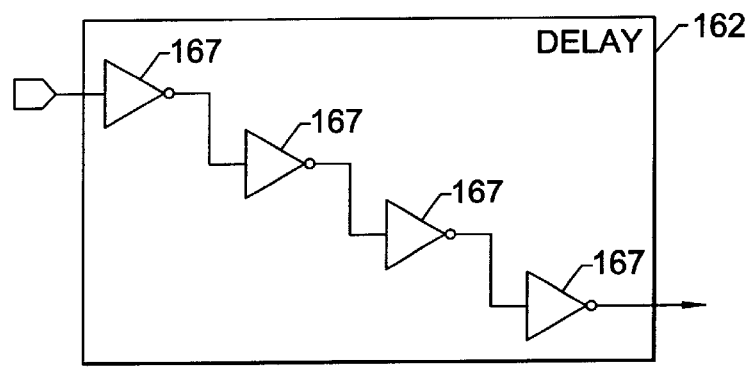

The width of the pulse is a function of the exclusive-OR 165 and the delay circuit 167. That is, the width of the ATD pulse is set by the length of the delay introduced by the delay circuit 162. In one embodiment, the delay circuit 167 includes a series of inverters 167, as shown in FIG. 8b. Each inverter may be formed by a pair of series connected n channel MOSFETs connected to a pair of series connected p channel MOSFETs. Other methods for delaying the address signal are acceptable, as will be readily known by one skilled in the art.

Figure 9:
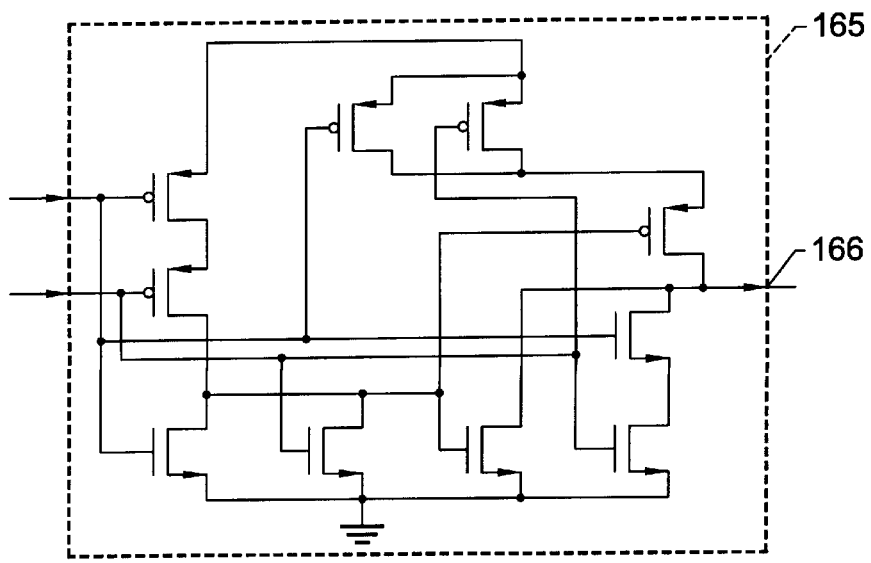
FIG. 9 is a schematic diagram of one embodiment of the exclusive-OR logic gate, according to the present invention.

The exclusive-OR 165 has been further modified to provided a symmetrically balanced waveform, as shown in FIG. 9. The orientation of the p channel MOSFETs and their sizes as connected to output 166 have be changed, as will be readily appreciated by one skilled in the art. A positive address transition now produces an identical pulse (width and rise time) in comparison to a negative address transition.

Another aspect of the invention relates to a method for precharging a plurality of bit line pairs 108a, 108b corresponding to a selected sub-array. The method includes the steps of dividing a plurality of memory cells 80 arranged in rows and columns into a plurality of sub-arrays, and detecting a row address transition for a selected one of the plurality of memory cells based upon a different received address signal and generating an ATD pulse in response thereto. The method further includes selecting one of the plurality of sub-arrays 77a–77m containing the selected memory cell 80, and providing the ATD pulse to the selected sub-array for precharging bit line pairs 108a, 108b associated therewith.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed:

1. A memory device comprising:
   a plurality of memory cells arranged in rows and columns and divided into a plurality of sub-arrays;
   a plurality of word lines connecting rows of said plurality of memory cells;
   a plurality of bit lines connecting columns of said plurality of memory cells;
   an address transition detect (ATD) circuit, wherein said ATD circuit generates an ATD pulse;
   a respective bit line precharge circuit for each of said plurality of sub-arrays; and
   an ATD pulse distribution circuit coupled between said ATD circuit and each of said bit line precharge circuits, the ATD pulse being distributed only to a selected sub-array containing a selected memory cell to activate only the bit line precharge circuit of the selected sub-array and not activate bit line precharge circuits of other non-selected sub-arrays.

2. A memory device according to claim 1, wherein said plurality of memory cells are divided into N blocks of memory cells and each block is divided into M sub-arrays; and wherein said ATD pulse distribution circuit comprises:

a block distribution circuit; and a plurality of sub-array distribution circuits;

said block distribution circuit distributes the ATD pulse to only a selected block containing the selected sub-array, and one of said plurality of sub-array distribution circuits distributing the ATD pulse from said block distribution circuit to the selected sub-array.

3. A memory device according to claim 2, further comprising a block address decoder coupled to said block distribution circuit.

4. A memory device according to claim 2, further comprising a respective sub-array address decoder coupled to each one of said sub-array distribution circuits.

5. A memory device according to claim 1, wherein said ATD circuit comprises a single address pulse generator coupled to a respective address input.

6. A memory device according to claim 5, wherein each single address pulse generator comprises:

a delay block having an input receiving an address signal and an output providing a delayed address signal; and an exclusive-OR gate having a first input receiving the address signal and a second input coupled to the output of said delay block.

7. A memory device according to claim 1, wherein each one of said memory cells comprises a static random access memory cell.

8. A memory device according to claim 1 is asynchronous.

9. A memory device comprising:

addressing circuitry;

an array of word lines and complementary bit line pairs coupled to said addressing circuitry;

a plurality of memory cells arranged in rows and columns and divided into a plurality of sub-arrays;

an address transition detect (ATD) circuit, wherein said ATD circuit generates an ATD pulse;

a respective bit line precharge circuit for each of said plurality of sub-arrays; and an ATD pulse distribution circuit coupled between said ATD circuit and each of said bit line precharge circuits, the ATD pulse being distributed only to a selected sub-array containing a selected memory cell to activate only the bit line precharge circuit of the selected sub-array and not activate bit line precharge circuits of other non-selected sub-arrays.

10. A memory device according to claim 9, wherein said plurality of memory cells are divided into N blocks of memory cells and each block is divided into M sub-arrays; and wherein said ATD pulse distribution circuit comprises:

a block distribution circuit; and a plurality of sub-array distribution circuits;

said block distribution circuit distributes the ATD pulse to only a selected block containing the selected sub-array, and one of said plurality of sub-array distribution circuits distributing the ATD pulse from said block distribution circuit to the selected sub-array.

11. A memory device according to claim 10, wherein said addressing circuitry comprises:

a block address decoder coupled to said block distribution circuit; and a respective sub-array address decoder coupled to each of said sub-array distribution circuits.

12. A memory device according to claim 9, wherein said ATD circuit comprises a single address pulse generator coupled to a respective address input.

13. A memory device according to claim 12, wherein each single address pulse generator comprises:

a delay block having an input receiving an address signal and an output providing a delayed address signal; and an exclusive-OR gate having a first input receiving the address signal and a second input coupled to the output of said delay block.

14. A memory device according to claim 9, wherein each one of said memory cells comprises a static random access memory cell.

15. A memory device according to claim 9 is asynchronous.

16. An address transition detect (ATD) pulse distribution circuit comprising:

an ATD circuit generating an ATD pulse;

an ATD pulse block distribution circuit coupled to said ATD circuit; and a plurality of blocks coupled to said ATD pulse block distribution circuit, each block comprising an ATD pulse sub-block distribution circuit;

said ATD pulse block distribution circuit distributing the ATD pulse to only one of said plurality of blocks so that only one ATD pulse sub-block distribution circuit distributes the ATD pulse to a selected location.

17. An ATD pulse distribution circuit according to claim 16, wherein said ATD circuit comprises a plurality of address pulse generators, each of said plurality of address pulse generators is coupled to a respective address line.

18. An ATD pulse distribution circuit according to claim 17, wherein each address pulse generator comprises:

a delay block having an input receiving an address signal and an output providing a delayed address signal; and an exclusive-OR gate having a first input receiving the address signal and a second input coupled to the output of said delay block.

19. An ATD pulse distribution circuit according to claim 16, further comprising a block address decoder coupled to said ATD pulse block distribution circuit.

20. An ATD pulse distribution circuit according to claim 16, further comprising a respective sub-block address decoder coupled to each of said ATD pulse sub-block distribution circuits.

21. An ATD pulse distribution circuit according to claim 16, wherein each of said ATD pulse sub-block distribution circuits is coupled to a respective bit line precharge circuit.

22. An ATD pulse distribution circuit according to claim 21, wherein said respective bit line precharge circuit is coupled to a plurality of static random access memory cells.

23. An electronic device comprising:

a microprocessor; and a memory device coupled to said microprocessor, said memory device comprising addressing circuitry coupled to said microprocessor, an input/output data buffer coupled to said microprocessor, an array of word lines and complementary bit line pairs coupled to said addressing circuitry and to said input/output data buffer, a plurality of memory cells arranged in rows and columns and divided into a plurality of sub-arrays, an address transition detect (ATD) circuit, wherein said ATD circuit generates an ATD pulse, a respective bit line precharge circuit for each of said plurality of sub-arrays, and an ATD pulse distribution circuit coupled between said ATD circuit and each of said bit line precharge circuits, the ATD pulse being distributed only to a selected sub-array containing a selected memory cell to activate only the bit line precharge circuit of the selected sub-array and not activate bit line precharge circuits of other non-selected sub-arrays.

24. An electronic device according to claim 23, wherein said plurality of memory cells are divided into N blocks of memory cells and each block is divided into M sub-arrays; and wherein said ATD pulse distribution circuit comprises:

a block distribution circuit; and a plurality of sub-array distribution circuits;

said block distribution circuit distributes the ATD pulse to only a selected block containing the selected sub-array, and one of said plurality of sub-array distribution circuits distributing the ATD pulse from said block distribution circuit to the selected sub-array.

25. An electronic device according to claim 24, further comprising a block address decoder coupled to said block distribution circuit.

26. An electronic device according to claim 24, further comprising a respective sub-array address decoder coupled to each of said sub-array distribution circuits.

27. An electronic device according to claim 23, wherein said ATD circuit comprises a single address pulse generator coupled to a respective address input.

28. An electronic device according to claim 27, wherein each single address pulse generator comprises:

a delay block having an input receiving an address signal and an output providing a delayed address signal; and an exclusive-OR gate having a first input receiving the address signal and a second input coupled to the output of said delay block.

29. An electronic device according to claim 23, wherein each one of said memory cells comprises a static random access memory cell.

30. An electronic device according to claim 23, wherein said memory device is asynchronous.

31. A method for reading a selected memory cell in a memory device comprising a plurality of memory cells arranged in sub-arrays, word lines connecting rows of memory cells, bit lines connecting columns of memory cells, and a respective bit line precharge circuit for each of the sub-arrays, the method comprising:

generating an address transition detect (ATD) pulse; and distributing the ATD pulse to only a selected sub-array containing a selected memory cell so as to activate only the bit line precharge circuit of the selected sub-array and not activate precharge circuits of other non-selected sub-arrays.

32. A method according to claim 31, wherein the plurality of memory cells are divided into N blocks of memory cells, and each block comprises M sub-arrays, the method further comprising:

distributing the ATD pulse to only a selected block containing the selected sub-array; and distributing the ATD pulse from the selected block to the selected sub-array.

33. A method according to claim 32, wherein the step of distributing the ATD pulse to only a selected block further comprises decoding a block address signal corresponding to the selected block.

34. A method according to claim 32, wherein the step of distributing the ATD pulse from the selected block to the selected sub-array further comprises decoding a sub-array address signal corresponding to the selected sub-array.

35. A method according to claim 31, wherein the step of generating an ATD pulse further comprises generating a pulse corresponding to an address signal received on a respective address line.

36. A method according to claim 35, wherein the step of generating the pulse comprises:

delaying the address signal; and using an exclusive-OR gate having a first input receiving the address signal and a second input receiving the delayed address signal.

37. A method according to claim 31, wherein a selected memory cell is a static memory cell.

38. A method according to claim 31, wherein the memory is asynchronous.

* * * * *